United States Patent
Smith et al.

[11] Patent Number: 5,861,599
[45] Date of Patent: Jan. 19, 1999

[54] ROD-FED ELECTRON BEAM EVAPORATION SYSTEM

[75] Inventors: P. A. Joel Smith, San Pablo; Ping Chang, Danville, both of Calif.

[73] Assignee: The BOC Group, Inc., New Providence, N.J.

[21] Appl. No.: 871,083

[22] Filed: Jun. 9, 1997

Related U.S. Application Data

[63] Continuation of Ser. No. 589,173, Jan. 19, 1996, abandoned.

[51] Int. Cl.6 .......................... C23C 14/30; B23K 15/00
[52] U.S. Cl. ...................... 219/121.15; 373/11; 373/14; 118/726
[58] Field of Search ................... 219/121.12, 121.15, 219/121.16, 121.17, 121.31; 373/10–17; 118/723 FE, 723 EB, 726; 164/506, 512, DIG. 5, DIG. 6; 266/200; 204/298.23, 298.02; 427/250, 596, 597

[56] References Cited

U.S. PATENT DOCUMENTS

| | | |
|---|---|---|
| 2,584,660 | 2/1952 | Bancroft ................................ 118/726 |
| 3,607,222 | 9/1971 | Kennedy ............................ 219/121.15 |
| 3,619,840 | 11/1971 | Spellman et al. ......................... 373/13 |
| 3,667,421 | 6/1972 | Bala et al. .............................. 118/726 |
| 3,710,072 | 1/1973 | Shrader et al. .................... 219/121.15 |
| 3,730,962 | 5/1973 | Norwalk .................................... 373/11 |
| 3,756,193 | 9/1973 | Carmichael et al. ................... 118/726 |
| 3,770,870 | 11/1973 | Kervizic et al. .......................... 373/10 |
| 4,109,061 | 8/1978 | Beale et al. ............................. 427/250 |
| 4,208,042 | 6/1980 | Aichert et al. ............................ 373/11 |
| 4,237,148 | 12/1980 | Aichert et al. . |

FOREIGN PATENT DOCUMENTS

| | | |
|---|---|---|
| 28 26 165 | 12/1979 | Germany . |
| 29 18 563 | 6/1980 | Germany . |
| 1-176070 | 7/1989 | Japan . |
| 5-78827 | 3/1993 | Japan . |

Primary Examiner—Gregory L. Mills
Attorney, Agent, or Firm—David M. Rosenblum; Salvatore P. Pace

[57] ABSTRACT

A rod-fed electron beam evaporation system having a rod-fed electron beam evaporation source for evaporating an ingot. The ingot is of rod-like configuration and has a peg-like element to self-engage a socket of a replacement ingot so that both ingot and replacement ingot are brought into alignment.

6 Claims, 2 Drawing Sheets

ROD-FED ELECTRON BEAM EVAPORATION SYSTEM

This is a continuation of application Ser. No. 08/589,173 filed Jan 19, 1996, now abandoned.

BACKGROUND OF THE INVENTION

The present invention relates to a rod-fed electron beam evaporation system in which a rod-like ingot is fed into a crucible of an electron beam evaporation source. More particularly, the present invention relates to such a system in which the ingot and a replacement ingot self-engage in an in-line relationship so that the ingot and replacement ingot can be urged upwardly into position within the crucible of the electron beam evaporation source.

In physical vapor deposition by electron beam evaporation, an evaporant is evaporated within a crucible to produce a vapor cloud which acts as a transport media to deposit the evaporant on a substrate. In a rod-fed electron beam evaporation source, the evaporant in the form of a rod-like ingot is upwardly fed into a central opening provided within a crucible. The ingot is evaporated within the crucible by an electron beam deflected through an arc of 270°. The ingot and replacement ingots are contained within a rotating magazine located within a vacuum chamber in which the electron beam evaporation source operates. Before each ingot has been spent, the ingot is held in position while a replacement ingot from the rotary magazine is aligned with the ingot being held. An ingot pusher pushes the replacement ingot in an upward direction, against the held ingot, to continue to raise the ingot being evaporated and the replacement ingot into the crucible. The ingot pusher is acted upon by a pusher platform which is raised and lowered by a ball screw mechanism.

Within the electron beam evaporation source, a permanent magnet and pole pieces are provided to produce the magnetic field that is used in deflecting the electron beam through the 270° arc. An electron beam gun used to produce the electron beam is situated opposite to the magnet and spaced therefrom to allow for passage of the ingot to the crucible. Even though electron beam evaporation sources are cooled by cooling water, the heat generated by the melting and evaporating ingot is conducted down the ingot to below the water cooled portion and then radiated to the crucible, to the pole pieces, permanent magnet and electron beam gun. Thus, the use of rod-fed electron beam evaporation sources has been limited to materials which melt at relatively low temperatures, for instance aluminum. Higher melting evaporants such as molybdenum have not been used in rod fed sources due to the high melting temperature of such materials and therefore, the high heat conduction to components of the electron beam evaporation source.

In order for a magazine fed electron beam evaporation source to properly function, there must be a great deal of precision in the fabrication and operation of the feed mechanism so that the replacement ingot is in perfect alignment with the ingot being evaporated. Additionally, there is a certain degree of complexity in such equipment in that not only must a rotating magazine and ingot pushing mechanism be provided but also a mechanism to hold the ingot during alignment of the replacement ingot. Such precise tooling and mechanical complexity translates into a large part of the fabrication costs of such an electron beam evaporation source.

As will be discussed, the present invention provides an electron beam evaporation system that does not require the same degree of mechanical precision and complexity as prior art rod-fed systems. Moreover, the system of the present invention is capable of evaporating ingots composed of materials having higher melting temperatures than materials of the prior art.

SUMMARY OF THE INVENTION

The present invention provides a rod-fed electron beam evaporation system that comprises a rod-fed electron beam evaporation source for evaporating an ingot composed of a substance to be evaporated. The ingot has a rod-like configuration and engagement means for self-engaging a replacement ingot in an in-line, end-to-end relationship. As will be discussed, such engagement means can include a peg-like element and a socket configured to receive the peg-like element. A means is provided for feeding the ingot and replacement ingot into the rod-fed electron beam evaporation source. In another aspect, the present invention provides an ingot for a rod-fed electron beam evaporation source that has a body of cylindrical, rod-like configuration. The body has a peg-like element at one end and a socket at the other end which is configured to receive the peg-like element.

In the present invention, since an ingot self-engages the replacement ingot, the feed mechanism does not have to be constructed to accomplish precise alignment of the replacement ingot with the ingot being evaporated. Hence, an electron beam evaporation system of the present invention can be constructed without the same degree of precision and therefore expense as prior art systems. As will also be discussed, in a further aspect, an electron beam source of the present invention does not require mechanisms to hold ingots in position during replacement operations. The lack of a requirement for such mechanisms also reduces fabrication costs of a system in accordance with the present invention. In still a further aspect of the present invention, the electron beam evaporation source is specifically designed to evaporate materials having high melting points as contrasted with evaporants used in prior art rod-fed sources.

BRIEF DESCRIPTION OF THE DRAWINGS

While the specification concludes with claims distinctly pointing out the subject matter that Applicant regards as his invention, it is believed that the invention will be better understood when taken in connection with the accompanying drawings in which:

DETAILED DESCRIPTION

Figure 1:
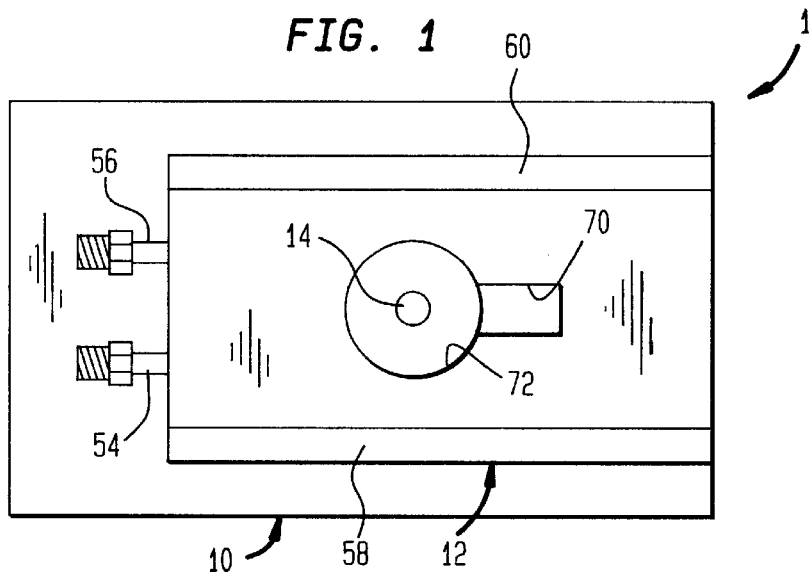
FIG. 1 is a fragmentary, top plan view of an electron beam evaporation system of the present invention.
Figure 2:
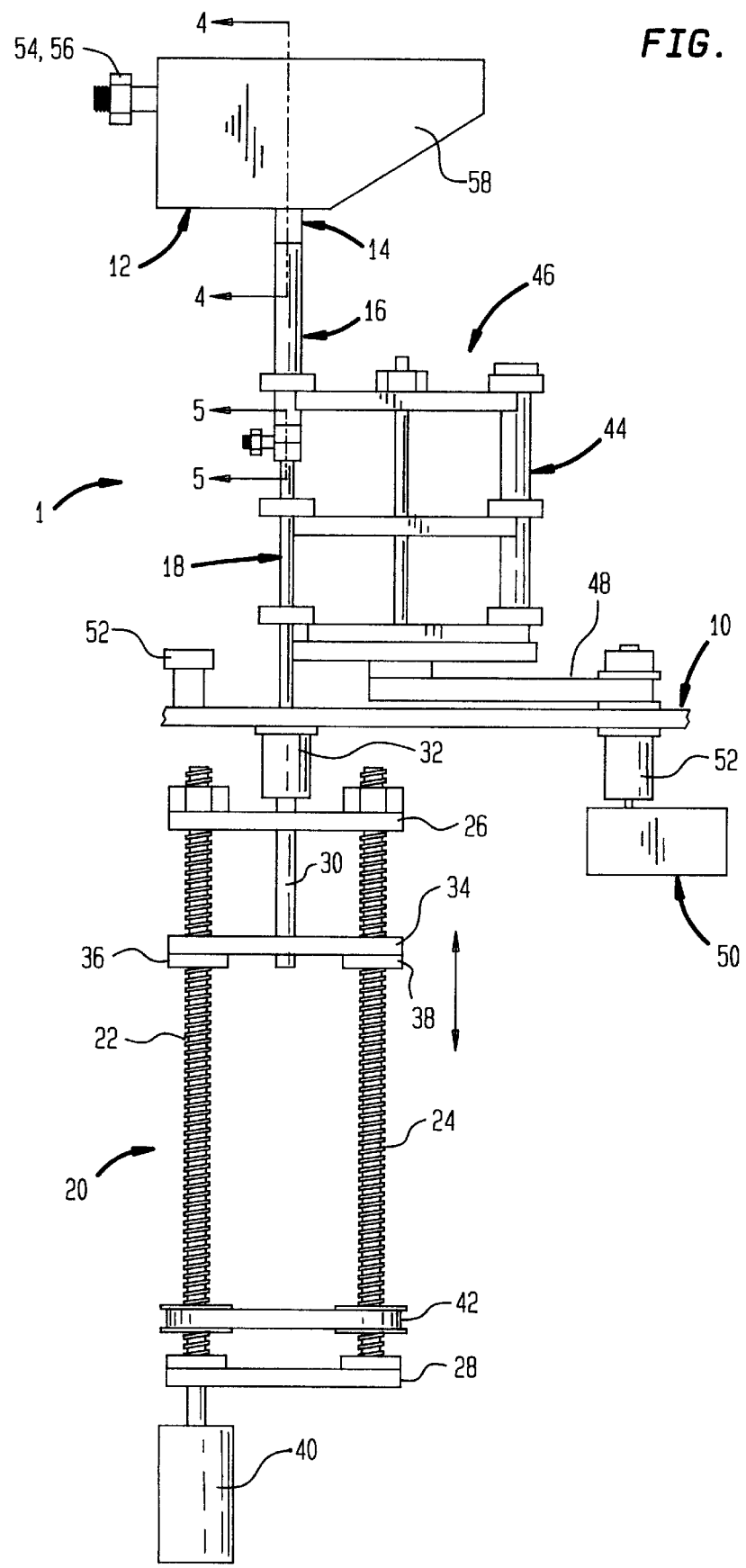
FIG. 2 is a fragmentary elevational view of FIG. 1.

With reference to FIGS. 1 and 2 an electron beam evaporation system 1 of the present invention is illustrated. Electron beam evaporation system 1 is designed to function within a vacuum environment of which a vacuum chamber plate 10 is illustrated. Not illustrated is the remainder of the chamber, substrate holder and load lock of the known environment in which electron beam evaporation system 1 functions. Electron beam evaporation system 1 is provided with a rod-fed electron beam evaporation source 12 for evaporating an ingot 14 composed of a substance to be evaporated. Ingot 14, as it evaporates, is urged upwardly by replacement ingot 16 which is in turn pushed by an ingot pusher 18.

Ingot pusher 18 is activated by a pusher mechanism 20 of known design having twin ball screws 22 and 24 that rotate within top and bottom plates 26 and 28. An actuation rod 30 acts through a linear vacuum feed through 32 to raise and lower ingot pusher 18. Actuation rod 30 is connected to a pusher platform 34 which has twin ball screw nuts 36 and 38. A power source 40 acts on a timing belt coupling 42 connected to twin ball screws 22 and 24. This in turn causes pusher platform 34 to raise and lower and thus activation bar 30 and ingot pusher 18. Although not illustrated, power source 40 would consist of high and low speed gear motors connected by an electric clutch and transmission. The high speed gear motor is provided for rapid retraction and extension of ingot pusher 18. Low speed gear motor operates ingot pusher 18 during use of electron beam evaporation source 12.

Replacement ingots such as replacement ingot 16 and replacement ingot 44 are contained within a rotary ingot magazine 46. Rotary ingot magazine 46 is connected by a steel roller-chain coupling 48 to an indexing drive gear motor 50. Gear motor 50 acts through a rotary vacuum feed through 52. Ingot position is sensed by a position sensor 52.

In operation, when a replacement ingot is required, ingot pusher 18 is retracted to allow rotary ingot magazine 46 to rotate a replacement ingot, such as replacement ingot 44, into position as sensed by ingot position sensor 52. Ingot pusher 18 then moves in a vertical direction to push a replacement ingot out of replacement rotary ingot magazine 46 into position engaged with the ingot that is currently being evaporated.

Figure 3:
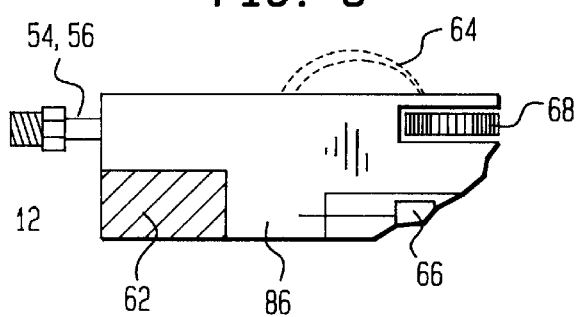
FIG. 3 is a fragmentary sectional view of FIG. 2.

With additional reference to FIG. 3, electron beam evaporation source 12 has inlets and outlets 54 and 56 to circulate cooling water within electron beam evaporation source 12. In a conventional manner, electron beam evaporation source 12 is also provided with pole pieces 58 and 60, and a permanent magnet 62 which causes 270° deflection of an electron beam 64 produced by an electron beam gun 66. Focusing coils 68 are provided to position and focus electron beam 64. Electron beam 64 passes through cutout 70 to engage ingot 14 within crucible 72.

Figure 4:
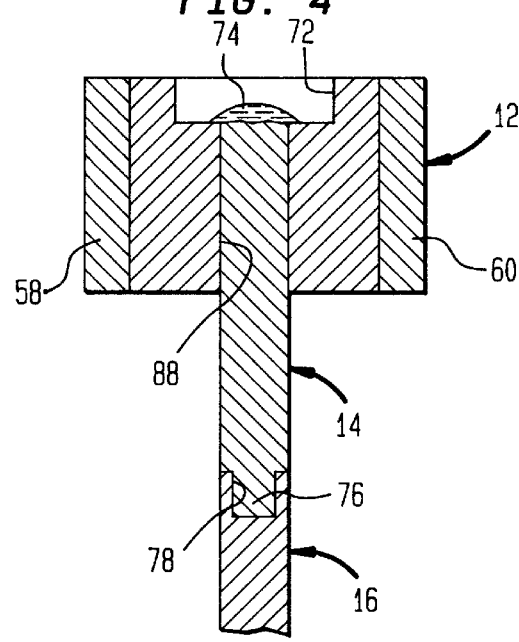
FIG. 4 is a sectional view of FIG. 2 taken along line 4—4 of FIG. 1.

With additional reference to FIG. 4, crucible 72 has a cylindrical configuration. It has been found that due to the cylindrical configuration of crucible 72, a melted portion 74 of ingot 14 is sufficient to hold ingot 14 in position during retraction of ingot pusher bar 18 and replacement of replacement ingot 16 into position. Therefore, there is no need for a holding mechanism to hold an ingot during manipulation of a new replacement ingot.

Each ingot has a rod-like configuration and is provided with a peg-like element 76, at one end, configured to be received in a socket 78 of a replacement ingot. Preferably, peg-like element 76 and socket 78 have a cylindrical, transverse cross-section. Each ingot in accordance with the present invention has a peg-like element 76, at one end, and a socket 78 at the other end so that the ingot being evaporated self-engages a replacement ingot. Such engagement of peg-like element 76 and socket 78 aligns ingot 14 and replacement ingot 16 into an in-line, end to end relationship without the use of precise positioning mechanisms.

Figure 5:
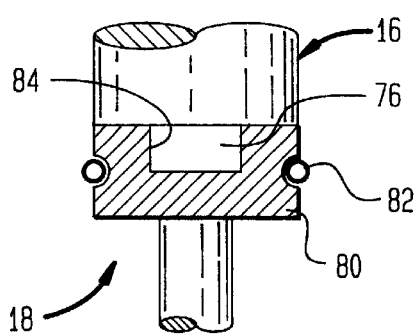
FIG. 5 is a sectional view taken along line 5—5 of FIG. 2.

With additional reference to FIG. 5, ingot pusher 18 is provided with a pedestal 80 and a pipe-like water cooling channel 82. Pedestal 80 is also provided with a socket-like recess 84 to engage peg-like element 76 of a replacement rod. The water cooling of pedestal 80 is necessary due to high temperature heat conduction of a material such as MOLYBDENUM. In this regard, electron beam evaporation source 12 is provided with a depending portion 86 (FIG. 3) having a bore 88 (FIG. 4) communicating with crucible 72 so that ingot 14 and replacement ingot and etc. pass through bore 88 and thus, depending portion 86, to crucible 72. Depending portion 86 separates permanent magnet 62 from electron beam gun 66 for heat conduction and radiation purposes so that electron beam evaporation source can be used with high temperature evaporants.

Although the present invention has been described with reference to a preferred embodiment, as will occur to those skilled in the art, numerous changes, omissions can be made without departing from the spirit and scope of the present invention.

We claim:

1. A rod-fed electron beam evaporation system comprising:

a rotary ingot magazine containing ingots, each of said ingots composed of a substance to be evaporated;

a rod-fed electron beam evaporation source for evaporating said ingots;

the rod-fed electron beam evaporation source overlying said rotary ingot magazine so that each of said ingots contained within said rotary ingot magazine can be fed in an upward direction towards said rod-fed electron beam evaporation source to serve as an evaporating ingot to be evaporated within the rod-fed electron beam evaporation source and prior to being evaporated, as a replacement ingot to contact said evaporating ingot in an in-line, end to end relationship;

each of said ingots having a rod-like configuration and engagement means for self-engaging one another so that said replacement ingot self-engages said evaporating ingot in said in-line, end to end relationship solely by being fed in said upward direction;

the rod-fed electron beam evaporation source having a crucible to which said ingot and replacement ingot are fed for evaporation and an underlying bore in communication with said crucible for feeding said ingot and replacement ingot to said crucible, said crucible having a cavity, the cavity having a constant radius greater than that of said bore so that a melted portion of said evaporating ingot located within said crucible holds said evaporating ingot in place just prior to self-engagement of said replacement ingot; and means for feeding said ingot and replacement ingot into said rod-fed electron beam evaporation source.

2. The system of claim 1, wherein said engagement means comprises each of said ingot and replacement ingot having a peg-like element, at one end, and a socket at the other end, the socket configured to receive said peg-like element.

3. The system of claim 2, wherein each of said ingot and replacement ingot is oriented so that said peg-like element is located below said socket.

4. The system of claim 1, wherein said feeding means includes a water cooled pedestal having a recess to receive said peg-like element and means for raising said pedestal and therefore said ingot and replacement ingot to said rod-fed electron beam evaporation source.

5. The system of claim 4, wherein said rod-fed electron beam evaporation source has:

a body portion;

an electron beam gun to produce an electron beam;

a permanent magnet attached to said body portion to deflect said electron beam through an arc of about 270°; and said body portion has a depending, extended portion located between said permanent magnet and said electron beam gun and through which said bore in part extends to shield said permanent magnet and said electron beam gun from heat radiated from said ingot and replacement ingot during evaporation.

6. The system of claim 1, wherein said rod-fed electron beam evaporation source has:

a body portion;

an electron beam gun to produce an electron beam;

a permanent magnet attached to said body portion to deflect said electron beam through an arc of about 270°; and said body portion has a depending, extended portion located between said permanent magnet and said electron beam gun and through which said bore in part extends to shield said permanent magnet and said electron beam gun from heat radiated from said ingot and replacement ingot during evaporation.

* * * * *